United States Patent [19]
Pahl et al.

[11] Patent Number: 6,057,222
[45] Date of Patent: May 2, 2000

[54] METHOD FOR THE PRODUCTION OF FLIP-CHIP MOUNTING-READY CONTACTS OF ELECTRICAL COMPONENTS

[75] Inventors: Wolfgang Pahl; Alois Stelzl; Hans Krüger, all of München, Germany

[73] Assignee: Siemens Aktiengesellschaft, Munich, Germany

[21] Appl. No.: 09/103,163

[22] Filed: Jun. 22, 1998

Related U.S. Application Data

[63] Continuation of application No. PCT/DE96/02412, Dec. 16, 1996, abandoned.

[51] Int. Cl.⁷ ................................................ H01L 21/44
[52] U.S. Cl. ...................... 438/612; 438/108; 438/127; 438/613; 438/614; 438/615; 228/180.21; 228/180.22
[58] Field of Search .................... 438/108, 127, 438/612, 613, 614, 615; 228/180.21, 180.22

[56] References Cited

U.S. PATENT DOCUMENTS 4,737,742   4/1988   Takoshima et al. .
5,172,212  12/1992   Baba .
5,329,068   7/1994   Hirata et al. .

FOREIGN PATENT DOCUMENTS

0590780A1   4/1994   European Pat. Off. .
0645807A1   3/1995   European Pat. Off. .
4302171A1   7/1994   Germany .

OTHER PUBLICATIONS

Japanese Patent Abstract No. 58047433 (Masanori), dated Sep. 29, 1984.

Primary Examiner—John F. Niebling
Assistant Examiner—David A. Zarneke
Attorney, Agent, or Firm—Herbert L. Lerner; Laurence A. Greenberg; Werner H. Stemer

[57] ABSTRACT

Contacts of SAW components are produced which are suitable for flip-chip mounting. Electrically conductive structures on a substrate are tightly encapsulated within a cover and contact pads of the electrically conductive structures are exposed in a window formed in the cover. Solderable layers are vapor deposited onto the contact pads of the electrically conductive structures after the cover is produced.

10 Claims, 1 Drawing Sheet

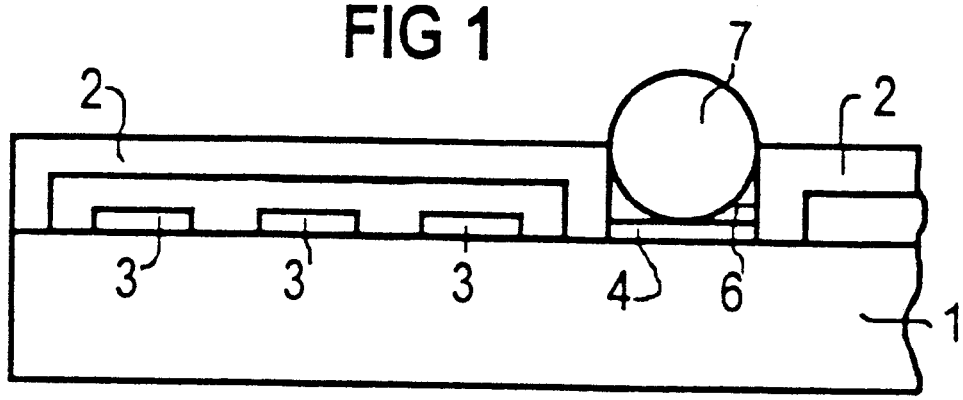
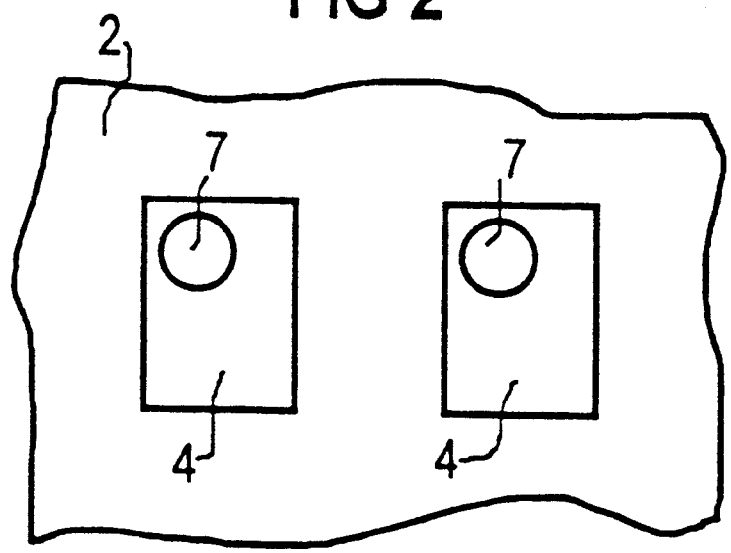

METHOD FOR THE PRODUCTION OF FLIP-CHIP MOUNTING-READY CONTACTS OF ELECTRICAL COMPONENTS

CROSS-REFERENCE TO RELATED APPLICATION

This is a continuation of international application PCT/DE96/02412, filed Dec. 16, 1996, which designated the United States, now abandoned.

BACKGROUND OF THE INVENTION

1. Field of the Invention

The present invention relates to a method for producing contacts of electrical components, the contacts being suitable for flip-chip mounting—particularly of components operating with surface acoustic waves (SAW components)—wherein electrically conductive structures on a substrate are encapsulated tightly against environmental influences by means of a cover in the form of a cap. The cover is formed with cutouts accommodating component structures in regions thereof, and a window is formed in the cover in which the pads of the electrically conductive structures being disposed.

An earlier, commonly owned application No. 08/743,540 (German application P 44 15 411.9) describes an encapsulation for electronic components with a cap that seals component structures on a substrate. The cap is formed by a cover which is provided on the substrate and has cutouts accommodating component structures in regions thereof. Such an encapsulation protects the component structures against environmental influences, with the result that electronic components encapsulated in such a way can be used directly in further applications, without the need for a further housing.

As miniaturization advances, the aim is to produce components which take up a minimal housing volume and have a small structural height. Such requirements are imposed, for example, on the use of electronic components in smart cards, such as telephone cards or credit cards, for example. Components with an encapsulation according to the above-mentioned earlier patent application fulfill these requirements in an optimum manner. This is particularly true when they are realized in a configuration which is suitable for flip-chip mounting.

To date, components suitable for flip-chip mounting have been mounted in a housing, in particular a ceramic housing. Selectively solderable layers with bumps must thereby be provided on the terminal pads of the component system. This necessitates a series of process steps which are highly problematic in particular for SAW components because, owing to overlapping planar finger structures, the probability of short circuits increases.

SUMMARY OF THE INVENTION

It is accordingly an object of the invention to provide a method of producing flip-chip mounting-ready contacts of electrical components, which overcomes the above-mentioned disadvantages of the heretofore-known methods of this general type and which enables the production of solderable layers of contacts which are suitable for flip-chip mounting, without impairing component structures.

With the foregoing and other objects in view there is provided, in accordance with the invention, a method of producing contacts of an electrical component—in particular a surface acoustic wave (SAW) component—which are suitable for flip-chip mounting, wherein the electrical component has electrically conductive structures on a substrate tightly encapsulated with a cap cover and the cap cover is formed with a window in which terminal pads of the electrically conductive structures are disposed, the method which comprises:

vapor-depositing at least one layer of solderable material over the cap cover and the window in the cap cover and forming a solderable layer contacting the contact pads of the electrically conductive structures;

structuring the layer of solderable material applied in the vapor-depositing step; and forming individual solderable layers each contacting a respective contact pad of the electrically conductive structures.

In an alternative mode of the invention, the method comprises providing a mask and vapor-depositing electrically conductive layers on the terminal pads of the electrically conductive structures through the mask.

In accordance with an added feature of the invention, the dimensions of the conductive layers are large relative to the dimensions of the contact pads of the electrically conductive structures.

In accordance with an additional feature of the invention, bumps which come into contact with the solderable layers are introduced into the window in the cap cover.

In accordance with a concomitant feature of the invention, vapor depositing is effected over the entire surface of the cap cover and the window, and the cover is used as a mask such that the vapor-deposited layer on the conductive layers is not conductively connected to vapor-deposited layer on the cap cover.

Other features which are considered as characteristic for the invention are set forth in the appended claims.

Although the invention is illustrated and described herein as embodied in method for the production of contacts of electrical components, the contacts being suitable for flip-chip mounting, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic side view of a SAW component produced by the method according to the invention; and FIG. 2 is a partial diagrammatic plan view of the component shown in FIG. 1.

DESCRIPTION OF THE PREFERRED EMBODIMENTS

Referring now to the figures of the drawing in detail and first, particularly, to FIG. 1 thereof, there is seen a SAW (surface acoustic wave) component generally comprising a piezoelectric substrate 1 and conductive structures 3 provided thereon. The conductive structures 3 include electrode fingers of interdigital transducers (IDT), resonators and reflectors. As described in the earlier patent application mentioned in the introduction—Ser. No. 08/743,540, which is herewith incorporated by reference—the electrically conductive structures 3 are covered by a cap 2, which protects the structures against environmental influences. The component can be directly used in further applications with the cover 2 and the substrate 1 forming its "housing".

The present invention provides for the production of contacts which are suitable for flip-chip mounting and serve for electrical contact-making of the conductive structures 3. A window 6 is provided in the cover 2, through which window a solderable layer 4 is applied which is in contact with a non-illustrated pad of the electrically conductive structures 3. In this case, the solderable layer 4 also lies on parts of the cover 2, as is evident from FIG. 2. The solderable layer 4 may be, for example, a chromium/chromium copper/copper/gold layer.

In order to produce solderable layers, according to one embodiment of the invention it is possible firstly to vapor-deposit a layer of solderable material over the whole area, that is to say also onto the entire cover 2, which is then structured to produce individual solderable layers 4, which are each in contact with pads of the electrically conductive structures 3.

According to another embodiment, the electrically solderable layers 4 can also be vapor-deposited through masks which define the layer dimensions.

After the production of the solderable layers, bumps 7 which come into contact with the solderable layers 4 are introduced into the windows 6 and soldered to the layers 4. The component can be mounted in an electrical circuit by means of these bumps 7.

The method according to the invention affords the advantage that the solderable layers 4 and the bumps 7 are not produced until after the application of the cover 2 which protects the component structures against environmental influences. This means that the component structures can no longer be impaired by influences resulting from the method steps in the course of the production of the solderable layers and of the bumps. A further advantage may be seen in the fact that the solderable layers can be produced in a large-area manner and their dimensions can therefore be large relative to those of the pads.

In order to avoid the structuring of a layer 4 which is vapor-deposited over the whole area, the windows 6 in the cover 2 may be configured in such a way that they act as masks for the conductive layers 4 and, at the same time, are not exposed to vapor deposition at their edges.

We claim:

1. A method of producing contacts of an electrical component which are suitable for flip-chip mounting, wherein the electrical component has electrically conductive structures on a substrate tightly encapsulated with a cap cover and the cap cover is formed with a window in which terminal pads of the electrically conductive structures are disposed, the method which comprises:

vapor-depositing at least one layer of solderable material over the cap cover and the window in the cap cover and forming a solderable layer contacting the contact pads of the electrically conductive structures;

structuring the layer of solderable material applied in the vapor-depositing step; and forming individual solderable layers each contacting a respective contact pad of the electrically conductive structures.

2. The method according to claim 1, wherein the electrical component is a SAW component.

3. The method according to claim 1, wherein dimensions of the conductive layers are large relative to dimensions of the contact pads of the electrically conductive structures.

4. The method according to claim 1, which further comprises introducing bumps coming into contact with the solderable layers into the windows in the cap cover.

5. The method according to claim 1, which comprises vapor depositing over an entire surface of the cap cover and the window, and utilizing the cover as a mask such that the vapor-deposited layer on the conductive layers is not conductively connected to vapor-deposited layer on the cap cover.

6. A method of producing contacts of an electrical component which are suitable for flip-chip mounting, wherein the electrical component has electrically conductive structures on a substrate tightly encapsulated with a cap cover and the cap cover is formed with a window in which terminal pads of the electrically conductive structures are disposed, the method which comprises:

providing a mask and vapor-depositing electrically conductive layers on the terminal pads of the electrically conductive structures through the mask.

7. The method according to claim 6, wherein the electrical component is a SAW component.

8. The method according to claim 6, wherein dimensions of the conductive layers are large relative to dimensions of the contact pads of the electrically conductive structures.

9. The method according to claim 6, which further comprises introducing bumps coming into contact with the solderable layers into the windows in the cap cover.

10. The method according to claim 6, which comprises vapor depositing over an entire surface of the cap cover and the window, and utilizing the cover as a mask such that the vapor-deposited layer on the conductive layers is not conductively connected to vapor-deposited layer on the cap cover.

* * * * *